(12) United States Patent
Fujiwara

(10) Patent No.: US 7,184,545 B2
(45) Date of Patent: Feb. 27, 2007

(54) SEMICONDUCTOR INTEGRATED CIRCUIT AND METHOD OF TESTING SEMICONDUCTOR INTEGRATED CIRCUIT

(75) Inventor: Makoto Fujiwara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 712 days.

(21) Appl. No.: 09/867,766

(22) Filed: May 31, 2001

(65) Prior Publication Data

US 2002/0010890 A1 Jan. 24, 2002

(30) Foreign Application Priority Data

May 31, 2000 (JP) .............. 2000-161343

(51) Int. Cl.
*H04L 9/00* (2006.01)
(52) U.S. Cl. ........................................ 380/2
(58) Field of Classification Search ................ 714/758, 714/30, 766, 5–6; 711/101, 102; 380/2
See application file for complete search history.

(56) References Cited

U.S. PATENT DOCUMENTS

| 4,438,512 | A | * | 3/1984 | Hartung et al. ............... 714/49 |
| 4,805,173 | A | | 2/1989 | Hillis et al. |
| 4,809,279 | A | | 2/1989 | Kim et al. |
| 4,905,142 | A | | 2/1990 | Matsubara et al. |
| 5,671,394 | A | * | 9/1997 | Katsuta ...................... 711/164 |
| 5,802,592 | A | | 9/1998 | Chess et al. |
| 5,860,099 | A | * | 1/1999 | Milios et al. ............... 711/103 |
| 6,006,354 | A | | 12/1999 | McGuinness |
| 6,185,678 | B1 | * | 2/2001 | Arbaugh et al. ............... 713/2 |
| 6,490,685 | B1 | | 12/2002 | Nakamura |

FOREIGN PATENT DOCUMENTS

| DE | 195 34 783 A1 | 11/1996 |
| JP | 57-006491 | 1/1982 |
| JP | 60-30000 | 2/1985 |
| JP | 11-175403 | 7/1999 |

* cited by examiner

*Primary Examiner*—Gilberto Barron
*Assistant Examiner*—Peter Poltorak
(74) *Attorney, Agent, or Firm*—McDermott Will & Emery LLP

(57) ABSTRACT

Confidential CRC codewords are stored along with confidential data words on a ROM. A checker subjects one of the confidential data words, which has been read out from the ROM, to the same type of calculation as a predetermined calculation that was carried out to produce associated one of the confidential CRC codewords. A comparator compares a result of the calculation performed by the checker to the associated confidential CRC codeword that has been read out from the ROM.

2 Claims, 4 Drawing Sheets

SEMICONDUCTOR INTEGRATED CIRCUIT AND METHOD OF TESTING SEMICONDUCTOR INTEGRATED CIRCUIT

BACKGROUND OF THE INVENTION

The present invention relates to a technique of testing a ROM that is built in a semiconductor integrated circuit.

FIG. 4 illustrates a configuration for a known ROM-built-in semiconductor integrated circuit with a tester. The circuit shown in FIG. 4 includes selectors 61 and 62 connected to the input terminals of a ROM 51 and another selector 63 connected to the output terminal of the ROM 51. The tester is made up of these three selectors 61, 62 and 63. When a test signal TEST received at an input terminal S is in logical one state (which will be herein referred to as "at H-level"), each of these selectors 61, 62 and 63 selects and outputs a signal received at another input terminal A.

In testing the ROM 51, the test signal TEST is asserted to H-level and supplied to the respective input terminals S of the selectors 61, 62 and 63. Then, input data received at external input terminals IN1 and IN2 are delivered as address and read inputs ADD and READ to the ROM 51 through the selectors 61 and 62, respectively. Subsequently, the output data DO of the ROM 51 is delivered through an external output terminal OUT by way of the selector 63. In this manner, according to the known technique, the ROM 51 is tested while allowing the user to control the input and output of data to/from the ROM 51 directly and externally.

However, where the user is allowed to control the data input and output to/from a ROM directly and externally, confidential information (e.g., microcode, secret keys and passwords), stored on the ROM, can be decoded easily by the third party such as hackers and crackers.

On the other hand, if a known built-in self-test (BIST) circuit is adopted, then the confidential information stored can have its security increased. However, to modify the contents of the confidential information, the BIST circuit itself, built in a semiconductor circuit, should be redesigned, thus considerably increasing the man-hour, the mask design cost and so on needed for the redesign process.

SUMMARY OF THE INVENTION

It is therefore an object of the present invention to make a ROM directly testable externally while ensuring a sufficient level of security for the confidential information stored on the ROM.

Specifically, a semiconductor integrated circuit according to the present invention includes: a ROM for storing confidential data thereon; a tester for testing the ROM; and means for storing redundancy check data that has been obtained by performing a predetermined calculation on the confidential data. The tester includes a checker that performs the same type of calculation as the predetermined calculation on the confidential data that has been read out from the ROM. And a result of the calculation performed by the checker is compared to the redundancy check data stored on the storage means.

In the inventive integrated circuit, the tester includes a checker. The checker subjects the confidential data, which has been read out from the ROM, to the same type of calculation as the predetermined calculation that was carried out to produce the redundancy check data. Then, the result of the calculation performed by the checker is compared to the redundancy check data stored on the check data storage means. In this manner, the confidential data stored on the ROM can be error-checked without allowing the third party to read out the confidential data from the integrated circuit, and yet the ROM can be tested without decreasing the security level of the confidential data.

In one embodiment of the present invention, the storage means is preferably included in the ROM.

In this particular embodiment, the redundancy check data and the confidential data may be stored at mutually different addresses on the ROM.

In an alternative embodiment, the redundancy check data and the confidential data may be stored at the same address on the ROM.

An inventive method of testing a semiconductor integrated circuit, including a ROM for storing confidential data thereon, includes the steps of: a) storing redundancy check data, which has been obtained by performing a predetermined calculation on the confidential data, on redundancy check data storage means of the integrated circuit; b) reading out the confidential data from the ROM and performing the same type of calculation as the predetermined calculation on the confidential data read out; and c) reading out the redundancy check data from the storage means and then comparing a result of the calculation performed in the step b) to the redundancy check data read out.

DESCRIPTION OF THE PREFERRED EMBODIMENTS

Hereinafter, preferred embodiments of the present invention will be described with reference to the accompanying drawings.

Figure 1:
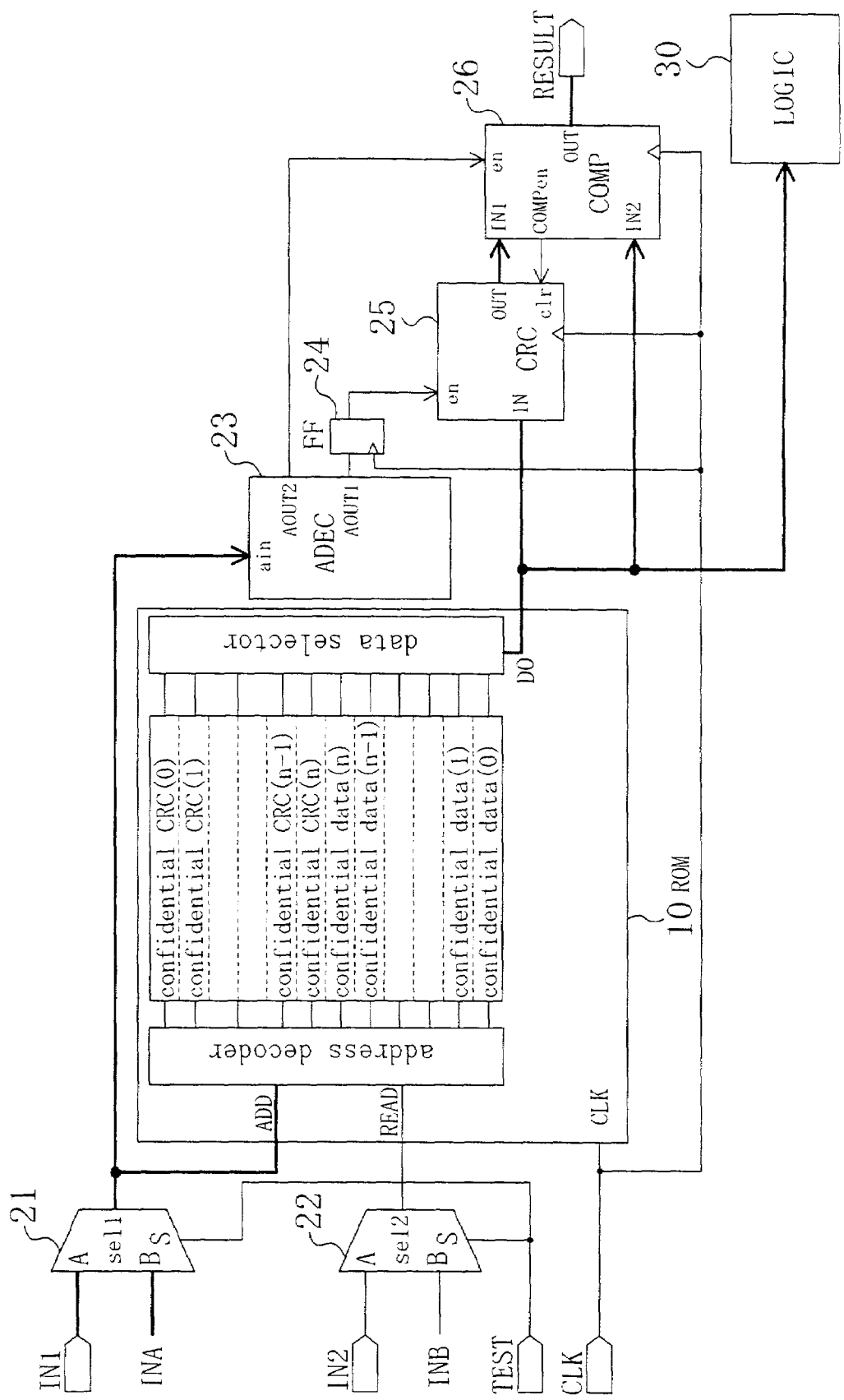
FIG. 1 is a block diagram illustrating a configuration for a semiconductor integrated circuit according to an embodiment of the present invention.

FIG. 1 illustrates a configuration for a semiconductor integrated circuit according to an embodiment of the present invention. The integrated circuit shown in FIG. 1 can test the ROM 10 without decreasing the security level of confidential information such as microcode, secret keys and passwords.

As shown in FIG. 1, a number (n+1) of confidential data words (0) through (n) are stored at respective low-order addresses of the ROM 10. Confidential CRC (cyclic redundancy check) codewords (0) through (n), which are equivalent to the "redundancy check data" as defined in the appended claims, have also been produced for the respective confidential data words (0) through (n) and are stored at respective high-order addresses of the ROM 10. In the example illustrated in FIG. 1, the ROM 10 includes the "redundancy check data storage means" as defined in the claims.

On the ROM 10, the confidential data words (0) through (n) are sequentially stored at the low-order addresses starting with the least significant bit (LSB) position thereof. On U the other hand, the confidential CRC codewords (0) through (n) are sequentially stored at the high-order addresses starting with the most significant bit (MSB) position thereof. For example, the confidential data word (0) is stored at the LSB position of the ROM 10, while the confidential CRC codeword (0), associated with this data word (0), is stored at the MSB position of the ROM 10. An addressing like this is suitably applicable to carrying out a complementary check on the ROM 10.

Also, in the circuit shown in FIG. 1, a tester is made up of selectors 21 and 22, address decoder (ADEC) 23, flip-flop (FF) 24, checker (CRC) 25 and comparator (COMP) 26. A logic circuit block (LOGIC) 30 for use in normal mode is further included in this circuit.

When a test signal TEST, received at respective input terminals S of the selectors 21 and 22, rises to H-level, the integrated circuit enters test mode. In test mode, each of the selectors 21 and 22 selects and outputs an input signal that the selector 21 or 22 has received at another input terminal A. Specifically, the selector 22 outputs a read signal READ to an address decoder included in the ROM 10. On the other hand, the selector 21 outputs an address signal ADD to the address decoder in the ROM 10 and to the ADEC 23 externally provided for the ROM 10. In response, the ADEC 23 decodes the address signal ADD, thereby controlling the CRC 25 and COMP 26. The CRC 25 performs a calculation on the confidential data words that have been read out from the ROM 10. The calculation carried out by the CRC 25 is of the same type as a predetermined calculation that was performed to produce the confidential CRC codewords. Then, the CRC 25 outputs the result OUT of the calculation to the COMP 26. In response, the COMP 26 compares the output OUT of the CRC 25 to the confidential CRC codewords that have been read out from the ROM 10. In FIG. 1, a clock signal CLK is delivered as synchronous clock pulses to the respective circuit blocks 10, 24, 25 and 26.

In normal mode, the test signal TEST falls to the logical zero state (which will be herein referred to as "L-level"). Then, each of the selectors 21 and 22 selects an input signal that the selector 21 or 22 has received at another input terminal B thereof. That is to say, the input data, supplied from another block of the integrated circuit and then received through a pair of external input terminals INA and INB, are delivered to the ROM 10. The output DO of the ROM 10 is also supplied to the LOGIC 30 in the normal mode.

As described above, in the test mode, the test signal TEST rises to the H-level, when each of the selectors 21 and 22 selects an input signal that the selector 21 or 22 has received at the input terminal A thereof. That is to say, the input data, received through another pair of external terminals IN1 and IN2, are supplied as the address and read signals ADD and READ to the ROM 10.

The input data, received through the external input terminal IN1, is also delivered as the address signal ADD to the ADEC 23. If the input data received through the external input terminal IN1 specifies one of the addresses (0) through (n) at which the confidential data words (0) through (n) are stored, then the ADEC 23 enables one AOUT1 of its outputs, i.e., asserts the output AOUT1 to H-level. One clock cycle after the output AOUT1 was asserted, the CRC 25, which also received the output DO of the ROM 10, starts to operate. On the other hand, if the input data received through the external input terminal IN1 specifies one of the addresses (n+1) through (2n+1) at which the confidential CRC codewords (n) through (0) are stored, then the ADEC 23 enables the other output AOUT2, i.e., asserts the output AOUT2 to H-level. When the output AOUT2 is asserted, the COMP 26 compares the result OUT of the calculation performed by the CRC 25 (received as IN1) to the specified confidential CRC codeword read out from the ROM 10 (received as IN2). And if the result IN1 of the calculation is found matching the CRC codeword IN2, then the COMP 26 asserts its output signal RESULT.

Figure 2:
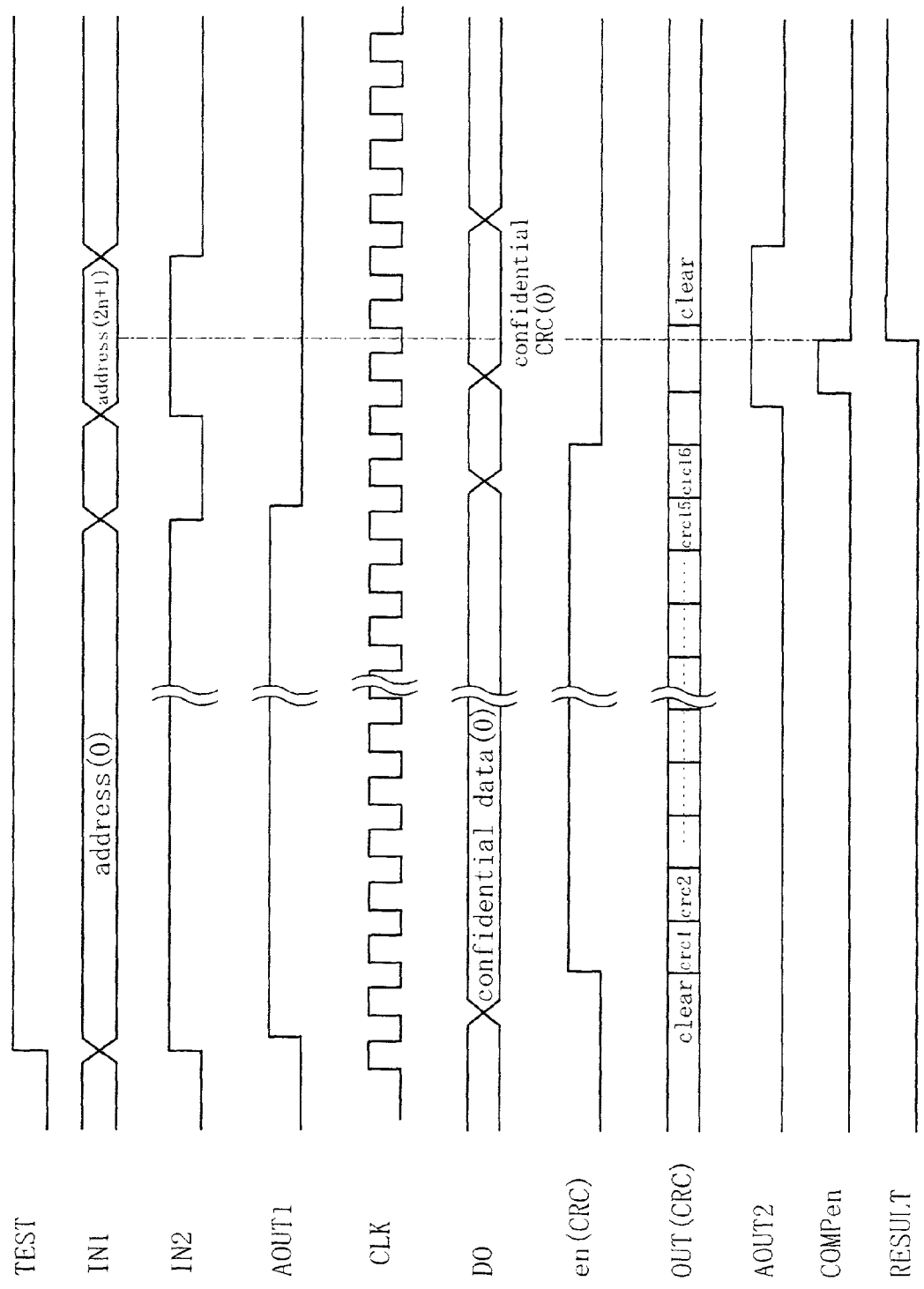
FIG. 2 is a timing diagram illustrating how the integrated circuit shown in FIG. 1 operates in test mode.

FIG. 2 illustrates how the integrated circuit shown in FIG. 1 operates in the test mode.

First, to make the integrated circuit enter the ROM test mode, the test signal TEST is asserted to H-level. Next, a signal, specifying the address (0) of the ROM 10 at which confidential data word (0) is stored, is input through the external input terminal IN1 and another H-level signal, enabling the read signal READ to the ROM 10, is input through the external input terminal IN2. In response, when the clock signal CLK rises next time, the confidential data word (0) is read out as the output DO of the ROM 10.

Also, the ADEC 23 has received the signal specifying the address (0), so outputs an H-level signal AOUT1. This output signal AOUT1 is latched at the FF 24 for one clock cycle and then delivered as an enable signal en to the CRC 25. In response, the CRC 25 starts to perform the CRC calculation on the confidential data word (0) that has been output from the ROM 10.

Next, one clock cycle before the CRC 25 finishes its CRC calculation, the input data received through the external input terminal IN1 is changed into a value other than the addresses (0) through (n) and the input data received through the external input terminal IN2 is negated to L-level. Then, the output AOUT1 of the ADEC 23 is also negated after a while and then the enable signal en input to the CRC 25 is also negated one clock cycle later. Accordingly, the result of the calculation performed by the CRC 25 is not output but retained there.

Subsequently, a signal, specifying the address (2n+1) of the ROM 10 at which confidential CRC codeword (0) associated with the confidential data word (0) is stored, is input through the external input terminal IN1. At the same time, another H-level signal, enabling the read signal READ input to the ROM 10, is input through the external input terminal IN2.

The ADEC 23 receives the signal specifying the address (2n+1), so outputs an L-level signal AOUT1 to the FF 24 and an H-level signal AOUT2 to the COMP 26. In response, the COMP 26 compares the output OUT of the CRC 25 to the output DO of the ROM 10, i.e., the confidential CRC codeword (0). And if the output OUT is found matching the output DO, then the COMP 26 asserts its output signal RESULT to H-level. Otherwise, the COMP 26 negates the signal RESULT to L-level.

Also, for one cycle time during the H-level period of the output AOUT2, a signal COMPen is asserted. When the signal RESULT is output, this signal COMPen is negated, thereby initializing the CRC 25.

In this manner, the confidential data word (0) can be tested successfully.

Similar operations will be performed with the other pairs of addresses (1) and (2n), (2) and (2n−1), . . . and (n) and (n+1) specified, and the signals RESULT are monitored externally. Based on these results, it is possible to determine whether or not any error has occurred at the ROM 10 due to some manufacturing problems, for example.

Figure 3:
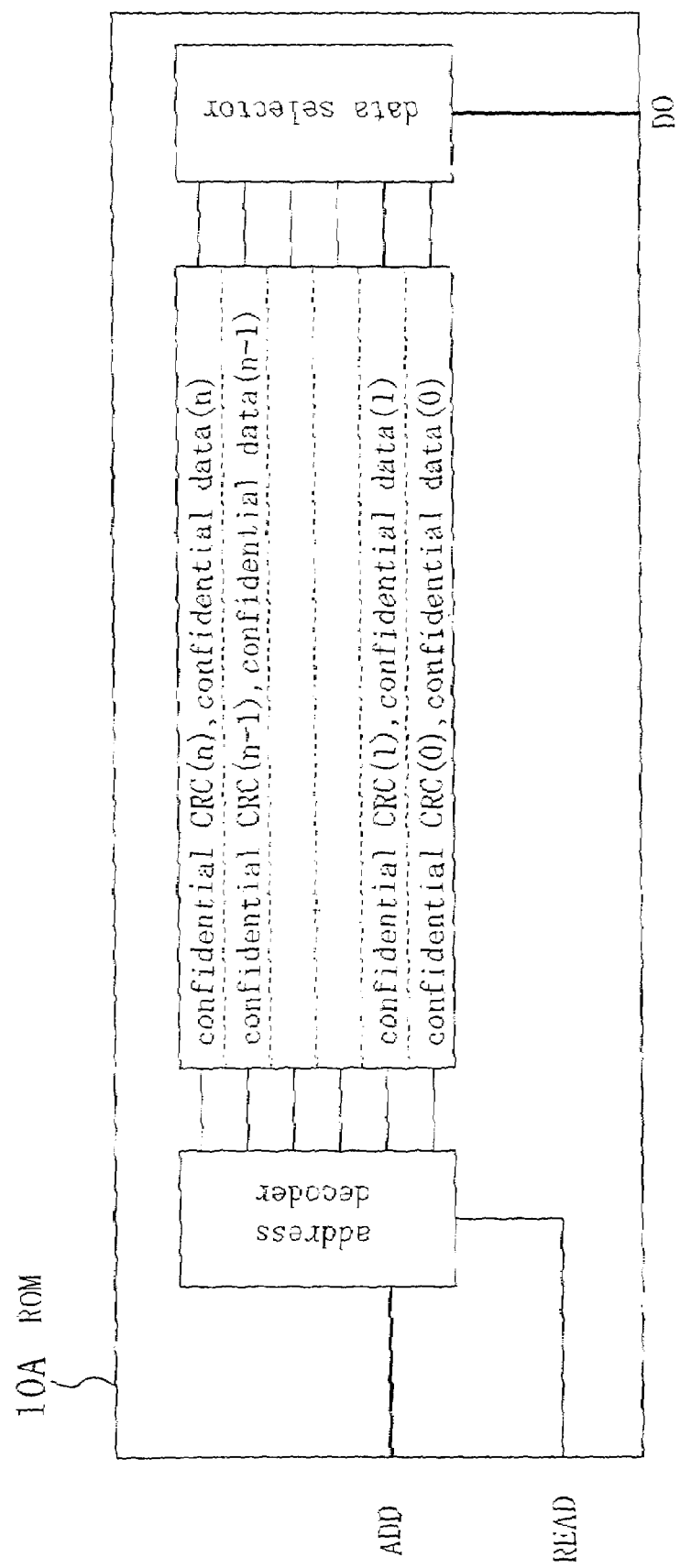
FIG. 3 illustrates an alternative data Storage format for the ROM shown in FIG. 1.
Figure 4:
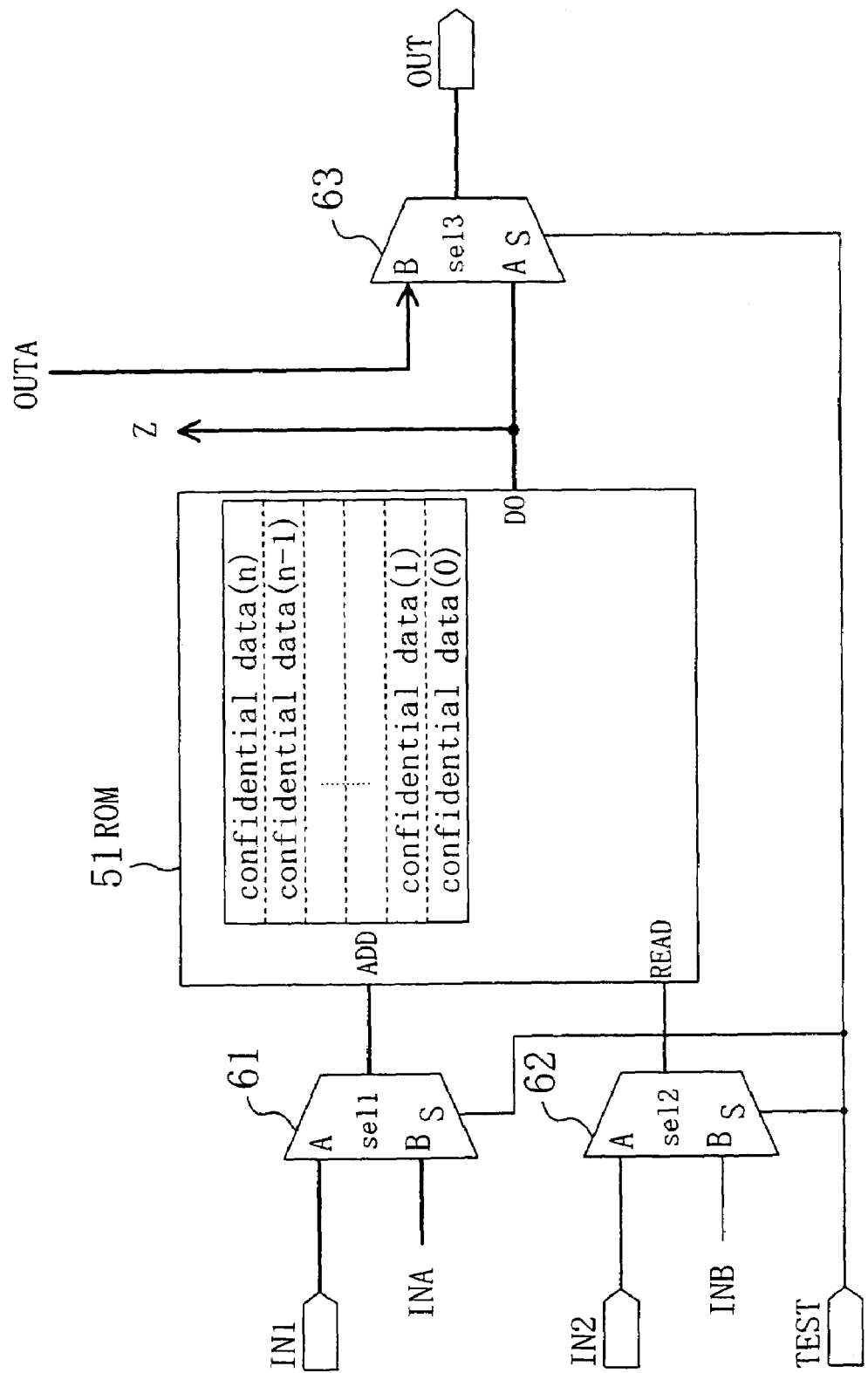
FIG. 4 is a block diagram illustrating a configuration for a known ROM-built-in semiconductor integrated circuit with a tester.

In the ROM 10 shown in FIG. 1, each confidential CRC codeword is stored at a different address from that of the associated confidential data word. Alternatively, each pair of confidential CRC codeword and confidential data word may be stored at the same address. For example, as shown in FIG. 3, the confidential CRC codewords may be mapped to respective bit positions that are in higher-order than the associated confidential data words.

Also, in the foregoing embodiment, the confidential CRC codewords are stored on the same ROM on which the confidential data words are stored. However, the confidential CRC codewords may also be stored on any other storage means (e.g., another ROM built in the semiconductor integrated circuit) provided separately from the ROM on which the confidential data words have been stored.

Moreover, according to the present invention, to modify the contents of confidential data, just the associated CRC codewords have to be changed and there is no need to change the configuration of the tester itself. Accordingly, the manhour and mask design cost required can be cut down considerably.

Furthermore, not just the CRC code but any other type of data may be used for checking the confidential data. In the latter case, however, a checker that performs the same type of calculation as the predetermined calculation that was carried out to produce the check data should also be included in the tester.

Furthermore, in the foregoing illustrative embodiment, the present invention has been described as being applied to a synchronous ROM. However, the present invention is easily implementable as well even if an asynchronous ROM is used.

As is apparent from the foregoing description, the present invention makes it possible to test a ROM built in a semiconductor integrated circuit without decreasing the security level of confidential data stored on the ROM.

What is claimed is:

1. A semiconductor integrated circuit comprising:
   a ROM for storing plural confidential data thereon address by address which has no external direct input path and can be read only from an internal circuit inside of the integrated circuit;
   a tester for testing the ROM address by address;
   a storage device, which is included in the ROM, for storing plural redundancy check data address by address that have been obtained by performing a predetermined calculation on each of the corresponding plural confidential data, the plural redundancy check data an each of the corresponding plural confidential data being stored at mutually different addresses on the ROM;
   a checker for performing the same calculation as the predetermined calculation on each of the plural confidential data that has been read out from the ROM address by address;
   a comparator for comparing a result of the calculation performed by the checker to each of the corresponding plural redundancy check data stored in the storage device address by address; and
   an address decoder which enables an operation of the comparator if an address is for the redundancy check data, and disables the operation of the comparator if the address is for the confidential data.

2. A method for testing a semiconductor integrated circuit including a ROM that stores plural confidential data thereon address by address and which can be read only from an internal circuit inside of the integrated circuit, the method comprising the steps of:
   a. storing plural redundancy check data, which have been obtained by performing a predetermined calculation on each of the corresponding plural confidential data, in a redundancy check data storage device included in the ROM;
   b. reading ou each of the plural confidential data from the ROM address by address and performing the same calculation as the predetermined calculation on each of the plural confidential data read out; and
   c. reading out each of the corresponding plural redundancy check data from the storage device address by address and comparing a result of the calculation performed in the step b) to each of the corresponding plural redundancy check data read out,
   wherein the plural redundancy check data and each of the corresponding plural confidential data are stored at mutually different addresses on the ROM,
   and the comparison is enabled if an address is for the redundancy check data, and disabled if the address if for the confidential data.

* * * * *